United States Patent
Nogi et al.

(10) Patent No.: US 9,620,286 B2
(45) Date of Patent: Apr. 11, 2017

(54) INSULATING MATERIAL, PASSIVE ELEMENT, CIRCUIT BOARD, AND METHOD OF MANUFACTURING AN INSULATING SHEET

(71) Applicants: NIPPON MEKTRON, LTD., Tokyo (JP); OSAKA UNIVERSITY, Suita-shi, Osaka (JP)

(72) Inventors: Masaya Nogi, Suita (JP); Katsuaki Suganuma, Suita (JP); Hirotaka Koga, Suita (JP); Natsuki Komoda, Suita (JP); Hirofumi Matsumoto, Tokyo (JP); Masayuki Iwase, Tokyo (JP); Kazuyuki Ozaki, Tokyo (JP); Keizo Toyama, Tokyo (JP)

(73) Assignees: NIPPON MEKTRON, LTD., Tokyo (JP); OSAKA UNIVERSITY, Osaka (JP)

( * ) Notice: Subject to any disclaimer, the term of this patent is extended or adjusted under 35 U.S.C. 154(b) by 350 days.

(21) Appl. No.: 14/311,546

(22) Filed: Jun. 23, 2014

(65) Prior Publication Data

US 2015/0014039 A1 Jan. 15, 2015

(30) Foreign Application Priority Data

Jul. 11, 2013 (JP) ................................ 2013-145390

(51) Int. Cl.
*H01G 4/16* (2006.01)
*H05K 1/09* (2006.01)
(Continued)

(52) U.S. Cl.
CPC ............. *H01G 4/16* (2013.01); *D21H 11/10* (2013.01); *D21H 21/14* (2013.01); *H01G 4/203* (2013.01);
(Continued)

(58) Field of Classification Search
CPC ........ H01G 4/16; H01G 4/203; H05K 1/0386; H05K 2201/09672; H05K 1/162; H05K 3/4602
(Continued)

(56) References Cited

U.S. PATENT DOCUMENTS

| | | | |
|---|---|---|---|
| 2007/0207692 A1 | 9/2007 | Ono et al. | |
| 2010/0143681 A1* | 6/2010 | Yano | B32B 17/067 428/216 |
| 2014/0080940 A1* | 3/2014 | Lee | C08L 63/00 523/447 |

FOREIGN PATENT DOCUMENTS

| | | |
|---|---|---|
| JP | S48108120 U | 12/1973 |
| JP | S49134903 A | 12/1974 |

(Continued)

OTHER PUBLICATIONS

Office Action dated Jan. 31, 2017, issued in Japanese Patent Application No. 2013-145390 with English (8 pages).

*Primary Examiner* — Sherman Ng
(74) *Attorney, Agent, or Firm* — Westerman, Hattori, Daniels & Adrian, LLP

(57) ABSTRACT

Disclosed are an insulating material (high-k layer) which includes a fiber assembly mainly composed of a cellulose nanofiber, and an electroconductive metal material supported by the fiber assembly; and a passive element (capacitor) which includes a high-k layer which is composed of the insulating material, and an electroconductive part stacked on the high-k layer.

18 Claims, 2 Drawing Sheets

(51) Int. Cl.
*H05K 1/00* (2006.01)
*H05K 1/16* (2006.01)
*D21H 21/14* (2006.01)
*D21H 11/10* (2006.01)
*H01G 4/20* (2006.01)
*H05K 3/46* (2006.01)
*H05K 1/03* (2006.01)
*H05K 1/02* (2006.01)

(52) U.S. Cl.
CPC ........... *H05K 1/0386* (2013.01); *H05K 1/162* (2013.01); *H05K 3/4602* (2013.01); *H05K 1/02* (2013.01); *H05K 3/4614* (2013.01); *H05K 2201/026* (2013.01); *H05K 2201/09672* (2013.01); *H05K 2203/178* (2013.01); *Y10T 428/249921* (2015.04)

(58) Field of Classification Search
USPC .......................... 174/257, 258, 260; 361/324
See application file for complete search history.

(56) References Cited

FOREIGN PATENT DOCUMENTS

| | | |
|---|---|---|
| JP | S5243886 A | 4/1977 |
| JP | 2008-242154 A | 10/2008 |
| WO | 2006/004012 A1 | 1/2006 |

\* cited by examiner

INSULATING MATERIAL, PASSIVE ELEMENT, CIRCUIT BOARD, AND METHOD OF MANUFACTURING AN INSULATING SHEET

This application is based on Japanese patent application No. 2013-145390, filed on Jul. 11, 2013, the content of which is incorporated hereinto by reference.

BACKGROUND

Technical Field

The present invention relates to an insulating material, a capacitor, a circuit board, and a method of manufacturing an insulating sheet.

Related Art

In recent years, efforts have been made to use a fiber assembly, configured by using cellulose, as an insulating material.

Cellulose is a biodegradable, and environment-conscious material, and is moreover expected to contribute to weight reduction of electronic parts or electronic devices, or, weight reduction and flexibilization of electronic parts or electronic devices.

For example, JP-A-2008-242154 discloses an invention regarding a flexible board which is configured by a composite material sheet obtained by compounding a cellulose nanofiber assembly with an amorphous rigid resin, and is directly laminated with a sheet glass (also referred to as "prior art 1", hereinafter).

The prior art 1 is aimed at improving the flexibility of the board by thinning the glass, and at reinforcing the flexible board through lamination of the composite material sheet.

On the other hand, JP-A-2008-242154 gives no description on a board mainly composed of cellulose nanofiber.

The insulating material such as insulating sheet, if successfully configured by mainly using a fiber assembly made of cellulose, would be preferable since lightness in weight and flexibility, inherent to cellulose, will be fully exhibited also in the insulating material. To configure the insulating material by mainly using cellulose has, however, faced technical problems.

More specifically, dielectric constant ($\in$) exhibited by cellulose per se is known to be 8 or around.

Efforts of paper-making, aimed to obtain the cellulose material such as pulp in a sheet form suited to general use for electronic parts, have however encountered the problems below. The dielectric constant ($\in$) of paper made by general method of paper-making is measured to be 2.0 to 2.5. That is, the dielectric constant ($\in$) of paper made into a sheet form is strikingly smaller than that of cellulose. The present inventors presumed that such reduction in dielectric constant is ascribable to avoid (air layer) which is formed among cellulose fibers in the process of paper-making.

The present inventors finely disentangling cellulose into nanofiber by a known means, and formed a cellulose nanofiber sheet. It was confirmed from our measurement that the cellulose nanofiber sheet showed the dielectric constant ($\in$) improved up to 5 or around. It is, however, necessary to further elevate the dielectric constant, in order to use the fiber assembly composed of cellulose nanofiber as an insulating material for electronic parts.

SUMMARY

The present invention was conceived after considering the above-described problems. The present invention provides an insulating material which has a fiber assembly mainly composed of a cellulose nanofiber, and is increased in the dielectric constant.

The present invention is to provide a method of manufacturing an insulating sheet capable of readily manufacturing a sheet-formed fiber assembly which is mainly composed of a cellulose nanofiber, and is increased in the dielectric constant.

The present invention is to provide a passive element which uses the insulating material of the present invention as a high-k layer, and is reduced in weight and improved in flexibility.

The present invention is to provide a circuit board which incorporates a capacitor as the passive element of the present invention, in which excellent performances of the capacitor are fully exhibited, and consequently has excellent performances directly ascribable to those of the capacitor, reduced in weight, and improved in flexibility.

According to the present invention, there is provided an insulating material which includes a fiber assembly mainly composed of a cellulose nanofiber, and an electroconductive metal material supported by the fiber assembly.

According to the present invention, there is provided a method of manufacturing an insulating sheet which is mainly composed of a cellulose nanofiber, the method includes:

filtering a suspension which contains a fiber material mainly composed of the cellulose nano fiber and an electroconductive metal material, to thereby form a filter sheet which contains the fiber material and the electroconductive metal material; and drying the filter sheet.

According to the present invention, there is provided a passive element which includes:

a high-k layer which is composed of the insulating material of the present invention; and an electroconductive part which is stacked on the high-k layer.

According to the present invention, there is provided a circuit board which includes:

a passive element which has a high-k layer composed of the insulating material of the present invention, and an electroconductive part which is stacked on the high-k layer; and interconnect boards which are opposed while placing the passive element in between.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

Figure 1:
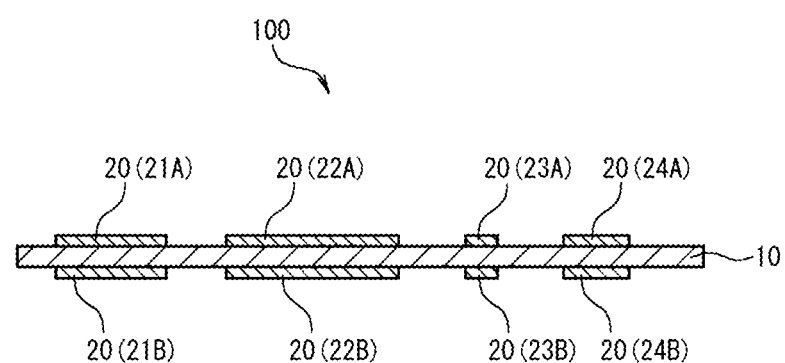
FIG. 1 is a cross sectional view illustrating a capacitor as one embodiment of the passive element of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

The insulating material of the present invention, and a manufacturing method will be explained. In addition, a passive element of the present invention and a circuit board, configured by using the insulating material of the present invention, will be explained referring to the attached drawings.

In all drawings, all similar constituents will be given the same reference signs to avoid repetitive explanation. This embodiment will occasionally be explained while defining the frontward, backward, leftward, rightward, upward and downward directions in the drawings. Note, however, that the definition is merely for the convenience sake to simplify explanation of relative relations among the constituents, and by no means limit the direction in which any product embodying the present invention is manufactured or used.

The various constituents of the present invention are not always necessarily be independent entities, instead allowing for example that one constituent forms a part of other constituent, and that a part of one constituent overlaps a part of other constituent. The individual constituents described in this embodiment may arbitrarily be diverted to other embodiments, without departing from the spirit of the present invention. The term "sheet" used in the present invention and in this specification widely covers general objects with small thickness, such as film, membrane and so forth. That is, "sheet" and "film" are not respectively defined in terms of thickness although the nomenclature differs, and simply may have a range of thickness suitable for use as the insulating material.

[Insulating Material]

The insulating material of the present invention has a fiber assembly mainly composed of a cellulose nanofiber (also referred to as "CNF", hereinafter), and an electroconductive metal material supported by the fiber assembly.

The insulating material of the present invention is successfully increased in the dielectric constant by virtue of the features described above, and can exhibit the dielectric constant which largely surpasses the dielectric constant ($\in$) exhibited as an intrinsic physical value of cellulose.

The present inventors found out from our thorough investigations that, by allowing the fiber assembly mainly composed of CNF to support the electroconductive metal material, the insulating material may successfully be increased in the dielectric constant, up to a level largely surpasses the dielectric constant exhibited as an intrinsic physical value of cellulose per se. Surprisingly, the present inventors made it possible to increase the dielectric constant by allowing the fiber assembly, mainly composed of CNF, to support an electroconductive metal material which should normally be prohibited to be used for insulating material. The findings led us to complete the insulating material of the present invention.

The insulating material of the present invention means a component used for establishing electrical isolation in electronic parts. The insulating material of the present invention is therefore not specifically limited, so long as the dielectric constant thereof falls in the range which ensures successful use as an insulating material in arbitrary electronic parts. Preferably, the insulating material of the present invention exhibits the dielectric constant which surpasses the value exhibited by an insulating material substantially composed of CNF only, before the dielectricity is upgraded.

For an exemplary case where the insulating material of the present invention is used as a high-k material, the dielectric constant ($\in$) is preferably 5 or above, more preferably 10 or above, and particularly 20 or above.

The dielectric constant ($\in$) relevant to the present invention represents specific dielectric constant.

Shape of the insulating material of the present invention is not specifically limited. The shape allowable for the insulating material of the present invention broadly encompasses shapes which allow the insulating material to be used as insulating materials in electronic parts. For example, from the viewpoint of downsizing of electronic devices, the shape preferably has a sheet form. The sheet-form insulating material is a thin insulating material typically having an average thickness of 1 μm or larger and 100 μm or smaller. Note that the term "sheet-form" in the present invention means all shapes which may be understood as being flat and membrane-like, such as film and membrane. The thickness of the insulating material may be calculated by measuring the thickness at arbitrary ten points using a commercially available thickness gauge, and then by finding an average value.

CNF in the present invention include nano-sized cellulose obtained by disentangling plant cellulose, and cellulose produced by microorganism. The CNF has a β-1,4-glucan structure. The CNF may be composed solely of a polymer of β-glucose, a polymer of β-glucose partially containing cellulosic derivative, or may substantially be composed of cellulose derivative only.

The "nano-size" herein means an average fiber diameter (average short axis length) of the CNF fallen in the range from 4 nm or larger and 900 nm or smaller. From the viewpoint of tightly supporting, among the fibers, the electroconductive metal material described later, the CNF preferably has an average fiber diameter of 4 nm or larger and 200 nm or smaller, and more preferably 4 nm or larger and 100 nm or smaller. The average fiber diameter fallen in the range described above is preferable also from the viewpoint below. That is, by adjusting the average fiber diameter to the range described above, the mass per unit area of the fiber assembly mainly composed of CNF will be reduced, and thereby the void (air layer) among fibers will be reduced. The reduction in dielectricity aimed by the present invention is successfully attained in this way.

The average fiber length (average long axis length) of the CNF is not specifically limited. From the viewpoint of ensuring thorough entanglement among fibers in the process of configuring the fiber assembly as an entangled composite using the CNF, the CNF preferably has an aspect ratio of 5 or larger, and more preferably 50 or larger. While the upper limit of the aspect ratio of CNF is not specifically limited from the viewpoint of good entanglement among fibers, the aspect ratio may be set to 200 or smaller, and even to 100 or smaller.

The average fiber diameter of CNF is given by randomly selecting 100 fibers of CNF under an electron microscope, measuring the width-wise length of the selected fibers at an arbitrary position, and finding an average of the obtained measured values. Similarly, the average fiber length of CNF is given by randomly selecting 100 fibers of CNF under an electron microscope, measuring the long axial length at an arbitrary position, and finding an average of the obtained measured values. The electron microscope is exemplified by a scanning electron microscope (JSM-6700F, from JEOL Ltd.), but not limited thereto.

In the present invention, the fiber assembly mainly composed of CNF means an assembly mainly composed of CNF, in which the fibers are gathered densely enough to keep a certain shape. For example, the fiber assembly includes non-woven fabric and woven fabric. The non-woven fabric includes those configured by fibers adhered to each other by a mechanical or chemical treatment, those configured by allowing the fibers to entangle with each other, and those configured by an arbitrary treatment and entanglement of fibers.

While the fiber assembly is mainly composed of CNF, a specific content of CNF is 90% by mass or more per 100% by mass of fiber assembly, preferably 95% by mass or more, and more preferably 99% by mass or more. While the fiber assembly in the present invention may be configured substantially by CNF, the fiber assembly does not exclude possibility of secondarily containing a fiber or a component other than CNF.

The fiber assembly supports the electroconductive metal material described later, to thereby configure the insulating material of the present invention. The term "support" herein means that the electroconductive metal material is embraced by the fiber assembly so as not to readily fall off. States of "support" include a state such that the electroconductive metal material is trapped among fibers of CNF which configures the fiber assembly, a state of being entangled with CNF, a state of fusing with, or adhering to CNF, or combinations of these states.

The electroconductive metal material in the present invention encompasses metal materials in general which exhibit electroconductivity. In other words, the electroconductive metal material excludes materials generally understood as non-electroconductive materials. The electroconductive metal material is preferably a metal which is usable as an electroconductive material in electronic parts. More specifically, the electroconductive metal material is exemplified by silver, copper, gold, aluminum, cobalt, nickel, and alloys of them, preferably having a volume resistivity of 2 μΩ·cm or larger and 100 μΩ·cm or smaller. Metal materials having larger volume resistivity values are, however, not excluded. Metal materials at least having volume resistivity smaller than that of the fiber assembly are selectable.

The electroconductive metal material may be powdery, flaky, fibrous, or may have any other arbitrary form without special limitation.

In particular, in the insulating material of the present invention, one preferable embodiment relates to the electroconductive metal material being a fibrous material.

The fibrous electroconductive metal material is likely to entangle with CNF when supported by the fiber assembly, and is successfully prevented from falling off from the fiber assembly.

After thorough investigations, the present inventors found out that, as compared with the non-fibrous electroconductive metal material, the fibrous electroconductive metal material remarkably increased the dielectricity only with a smaller amount thereof supported by the fiber assembly. While a mechanism interpreting the finding remains unclear, it is supposed as follows. That is, the fibers of the electroconductive metal material are supposed to locally overlap with each other inside the fiber assembly, thereby a plurality of pseudo-electrodes are configured so as to oppose with each other while placing the CNF in between, as if forming micro-capacitors. It was therefore supposed that the insulating material of the present invention is remarkably elevated in dielectricity, by virtue of the capacitor-like configuration which resides inside the fiber assembly. It was also supposed that when the amount of fibrous electroconductive metal material supported by the fiber assembly increases, a continuous conduction path is formed inside the fiber assembly, and thereby the electrical resistivity increases so as to make the fiber assembly no longer recognizable as an insulating material.

The fibrous electroconductive metal material may be an arbitrary metal material which is preferably usable as the electroconductive metal material as described above. Examples include metal materials composed of silver, or combination of silver and other metal; and metal materials composed of copper, or combination of copper and other metal, but not limited thereto. Preferable examples of the other metal material to be combined with silver or copper include a metal material nobler than silver, and a metal material nobler than copper.

In the present invention, the fibrous electroconductive metal material refers to an electroconductive metal material having the average fiber length larger than the average fiber diameter. In particular, the aspect ratio of the fibrous electroconductive metal material is preferably 5 or larger, and more preferably 10 or larger. The larger the aspect ratio of the fibrous electroconductive metal material, the better the entanglement between the electroconductive metal material and CNF as a general trend, and thereby the falling-off may become avoidable. Similarly, the larger the aspect ratio, the better the dielectric constant will be, even with a small content of the fibrous electroconductive metal material in the insulating material. From this point of view, the upper limit of aspect ratio of the fibrous electroconductive metal material is typically 200 or smaller, or 100 or smaller, while not specifically limited.

The average fiber diameter and the average fiber length of the fibrous electroconductive metal material are not specifically limited. For example, the average fiber diameter is preferably 200 nm or smaller, and more preferably 100 nm or smaller. As for the fibrous electroconductive metal material, the smaller the average fiber diameter, the better the entanglement with CNF as a general trend. From this point of view, the lower limit of the average fiber diameter of the fibrous electroconductive metal material is typically 5 nm or larger, or 10 nm or larger, while not specifically limited. For example, the average fiber length is preferably 1 μm or larger, and more preferably 10 μm or larger. As for the fibrous electroconductive metal material, the larger the average fiber length, the better the entanglement with CNF as a general trend. From this point of view, the upper limit of the average fiber length of the fibrous electroconductive metal material is typically 80 μm or smaller, or 40 μm or smaller, while not specifically limited. The average fiber diameter and average fiber length of the fibrous electroconductive metal material may be determined in the same way with the average fiber diameter and the average fiber length of CNF.

The insulating material of the present invention is mainly composed of CNF, and is therefore excellent in surface smoothness. The surface smoothness of the insulating material of the present invention is further ensured by using the fibrous metal material as the electroconductive metal material. Good surface smoothness of the insulating material is advantageous in view of stacking the electroconductive part directly on the surface of the insulating material. A good surface smoothness also ensures good printability, when the electroconductive part is formed by printing directly or indirectly on the insulating material.

From the viewpoint that the fiber assembly is configured by allowing CNF and the fibrous electroconductive metal material to entangle with each other, (Average fiber length CNF):(Average fiber length of fibrous electroconductive metal material) preferably falls in the range from 1:0.1 to 1:10.

As has been described above, the insulating material of the present invention is elevated in the dielectricity, by virtue of the electroconductive metal material supported by the fiber assembly mainly composed of CNF. In other words, despite inclusion of the electroconductive metal material, the insulating material of the present invention exhibits a proper level of electrical resistivity suitable for insulating material, and is elevated in the dielectricity.

The insulating material of the present invention preferably exhibits a product of dielectric constant (∈) and electrical resistivity (Ω·cm) of $1\times10^{11}$ or larger. The present invention fallen in the numerical range is remarkably improved in the dielectric constant, and given with good electrical performances such as a good electrical resistivity suitable for insulating material, despite use of the electroconductive metal material.

While the upper limit of the numerical range of the product regarding the insulating material of the present invention is not specifically limited, a product of $1\times10^{12}$ or smaller will suffice, when the insulating material of the present invention is planned to be used for general electronic parts.

One notable electrical characteristic of the insulating material of the present invention relates to a tendency of preventing the dielectric loss tangent from increasing, despite notable increase in the dielectric constant. More specifically, the insulating material of the present invention satisfies a relation between the dielectric loss tangent (tan δ) and dielectric constant (∈) given by (Formula 1) below:

(Mathematical Formula 1)

[Dielectric loss tangent(tan δ)/Dielectric constant (∈)]×100≤2.0    (Formula 1)

While the lower limit of the numerical range given by (Formula 1) is not specifically limited, it is ideal to adjust the transmission loss to 0 (dielectric loss tangent (tan δ) is 0), which is larger than 0 and not larger than 2.0 in general.

The insulating material of the present invention is elevated in the dielectricity, and is suppressed from increasing in the dielectric loss tangent. Accordingly, the insulating material of the present invention is successfully usable, for example, for a high-k sheet as an antenna part. The antenna part herein means a sort of antenna fabricated in plane, which is exemplified by patch antenna. In other words, this is an antenna part configured by a high-k sheet and an antenna conductor corresponded to a predetermined frequency stacked on the high-k sheet. The antenna part configured by using the insulating material of the present invention as the high-k sheet exhibits advantages described below. The antenna conductor herein include monopole antenna, dipole antenna, and self-similar antenna.

More specifically, the high-k sheet is mainly composed of CNF. The antenna part is therefore reduced in weight and is made flexible. The high-k sheet is even increased in the dielectricity as compared with conventional paper materials, or a sheet substantially composed of CNF only. Accordingly, the antenna conductor may be shortened, and this promotes downsizing and weight reduction of the antenna part. The high-k sheet tends to increase in the dielectric loss tangent, but in a more suppressed manner as compared with the degree of increase in the dielectricity. Transmission loss of antenna may, therefore, be well suppressed. In addition, the high-k sheet mainly composed of CNF is biodegradable. Accordingly, the antenna configured by the high-k sheet is also usable as antennas which are installed outdoors at a plurality of points and left unrecovered after disused.

One preferable embodiment of the above-described insulating material of the present invention is as follows. That is, the insulating material of the present invention may be configured to contain a silver-based fibrous material as the electroconductive metal material, wherein the content of the silver-based fibrous material is 20 parts by mass or less per 100 parts by mass of the cellulose nanofiber.

The silver-based fibrous material encompasses fibrous material substantially composed of silver, fibrous material composed of silver and metal other than silver, and fibrous material containing silver and arbitrary additive other than silver.

Feature of the present invention may be understood from another viewpoint regarding the ratio of the cellulose nanofiber and the fibrous electroconductive metal material supported by the cellulose nanofiber. That is, in the insulating material of the present invention, the total length of fiber of the fibrous electroconductive metal material supported by 100 g of CNF is preferably $1\times10^{7}$ m or longer and $5\times10^{8}$ m or shorter. In this range, fibers of the fibrous electroconductive metal material supported by CNF are allowed to overlap with each other reasonably enough to increase the dielectric constant, and are prevented from forming conduction paths so as to make the insulating material no longer assumable as substantially insulative.

The total length of fiber of the fibrous electroconductive metal material may now be determined as described below. First, the content of the CNF and fibrous electroconductive metal material in the insulating material is determined by component analysis. Also the average fiber diameter and the average fiber length of the fibrous electroconductive metal material are determined. Then, the total fiber quantity of the fibrous electroconductive metal material contained in the insulating material is determined, based on the specific gravity of the fibrous electroconductive metal material. The total fiber quantity is then multiplied by the average fiber length to find the total length, and the result is converted to the total length per 100 g of CNF.

On the other hand, from the viewpoint of using the material, which is configured to allow CNF to support the fibrous electroconductive metal material, as the insulating material, the volume fraction of the fibrous electroconductive metal material in that material is preferably set to 3 vol % or less.

The above-described embodiment of the present invention exhibits remarkable effects of increasing the dielectricity, and of suppressing increase in dielectric loss tangent. In particular, it is preferable that the average fiber diameter of CNF is 100 nm or smaller, the average fiber diameter of the silver-based fibrous material is 50 nm or larger and 100 nm or smaller, and the average fiber length of the silver-based fibrous material is 5 μm or longer and 15 μm or shorter. In these ranges, the insulating material of the present invention shows a remarkable improvement in the dielectric constant.

In this embodiment, the dielectric constant tends to increase by increasing the amount of supported silver-based fibrous material. There is also a tendency of decrease in the dielectric constant, as the amount of supported silver-based fibrous material decreases. These tendencies are also observable in other electroconductive metal material, irrespective of the silver-based fibrous material. In conclusion, the dielectric constant of the insulating material of the present invention may be adjusted to a desired value, by controlling the amount of electroconductive metal material to be supported by CNF.

[Method of Manufacturing Insulating Sheet]

A method of manufacturing the insulating sheet of the present invention (also referred to as "manufacturing method of the present invention", hereinafter) will be explained. The manufacturing method of the present invention is suitable as a method of manufacturing the above-described insulating material of the present invention, particularly obtained in a sheet form. Note, however, that the sheet-like insulating material of the present invention may be manufactured by a method other than the manufacturing method of the present invention.

As described above, the manufacturing method of the present invention is a method of manufacturing the insulating sheet mainly composed of a cellulose nanofiber. The manufacturing method of the present invention has a filtration step in which a suspension which contains a fiber material mainly composed of the cellulose nanofiber and an electroconductive metal material is filtered, to thereby form a filter sheet which contains the fiber material and the electroconductive metal material. The manufacturing method of the present invention also has a drying step in which the filter sheet is dried, succeedingly to the filtration step.

According to the manufacturing method of the present invention, the insulating sheet which is successfully elevated in dielectricity may be manufactured by a simple process.

Next, the manufacturing method of the present invention will be detailed, also making reference to arbitrary processes. CNF and the electroconductive metal material, used for the manufacturing method of the present invention, are same as those used for the insulating material of the present invention, and will not therefore be detailed again. CNF used herein for the manufacturing method of the present invention may be a preliminarily prepared CNF available from elsewhere, or may be a CNF prepared by a known method before the filtration step.

CNF may be prepared typically by subjecting pulp (for example, pulp for paper making) to mechanical processing or chemical treatment. A method of physically grinding the pulp under stirring is known as the mechanical processing. In dry mechanical grinding, a grinding aid is preferably added in order to avoid aggregation of fibers which would occur during a prolonged grinding. On the other hand, a technique of using a water jet system is known as wet mechanical grinding. A known chemical treatment is such as treating pulp fiber using sulfuric acid, so as to remove an amorphous moiety by hydrolysis. Alternatively, CNF produced by microorganism such as a certain species of *acetobacter* may be used for the insulating material of the present invention. It is still allowable to mix the microorganism-derived CNF and the pulp-derived CNF.

Using CNF prepared by an arbitrary method, the filtration step is conducted. In the filtration step, first, a suspension which contains CNF and an electroconductive metal material is prepared. Solvent for preparing the suspension is exemplified by water, ethanol, or the like.

In the manufacturing method of the present invention, the suspension may appropriately contain additive(s) without departing from the spirit of the present invention. For example, a dispersant may be added to the suspension, in order to improve dispersibility of the electroconductive metal material in the suspension.

While means for filtration of the suspension is not specifically limited, it is general to use a filter membrane capable of separating CNF and the electroconductive metal material, from the liquid phase. The filtration surface of the filter membrane is preferably flat. CNF and the electroconductive metal material separated on the filtration surface are obtained in the form of flat residue.

The filter membrane used herein is appropriately selectable from porous film with a suitable pore size, filter with a small mass per unit area, and so forth.

The filtration is selectable from natural filtration, filtration under reduced pressure and so forth, and is conducted under arbitrary pressure not specifically limited, so as to form the filter sheet on the filter membrane. Filtration under reduced pressure is particularly preferable, from the viewpoint of ensuring appropriate suction speed and suction pressure, and of later enabling separation of the residue (filter sheet) from the filter membrane, without damaging the residue (filter sheet). The filtration under reduced pressure includes vacuum filtration. By filtering the suspension under an appropriate pressure, the filter sheet formed on the filter membrane is densified, thereby an appropriately dense sheet is formed. This makes the separation between the filter sheet and the filter membrane easier.

The filtration step is followed by separation of the filter sheet from the filter membrane, and by the drying step in which the filter sheet is dried, to manufacture the insulating sheet. The drying step may be implemented without special limitation, typically by natural drying, drying under heating, drying with the aid of chemical such as drying agent, and by any combinations of these methods.

For example, a pressing step in which the filter sheet is pressed is conducted concurrently with the drying step. In this way, the filter sheet in the process of drying is prevented from shrinking or warping, to thereby give a flat and smooth insulating sheet. Concurrent implementation of the drying step and pressing step includes a case where the duration of the drying step and the duration of the pressing step entirely overlap, and a case where both durations partially overlap.

A preferable mode of concurrent implementation of the pressing step and the drying step is as follows.

First, when the filter sheet is separated from the filter membrane, a non-water permeable base such as sheet glass is placed on the exposed surface of the filter sheet formed on the filter membrane. The filter membrane is separated while supporting the filter sheet with the non-water permeable base.

Next, a water permeable base is placed on the exposed surface of the filter sheet transferred onto the non-water permeable base. The water permeable base is typically a metal mesh filter. Next, a water absorptive sheet is placed on the exposed surface of the metal mesh filter. The water absorptive sheet is typically a paper towel. In this way, a stack as viewed from one side is now configured by the non-water permeable base, the filter sheet placed on the non-water permeable base, the water permeable base placed on the filter sheet, and the water absorptive sheet placed on the water permeable base. The stack is then set on a press machine, and pressed under pressure from both sides, or from one side. In this way, water contained in the filter sheet permeates into the water absorptive sheet, thereby the filter sheet is dewatered. By controlling the temperature during the pressing to a level suitable for the drying step, the drying step and the pressing step may be conducted concurrently.

Pressure to be applied in the pressing step is preferably 0.01 MPa or larger and 10 MPa or smaller, and more preferably 0.2 MPa or larger and 3 MPa or smaller. The drying temperature in the drying step is preferably 100° C. or higher and 200° C. or lower. For example, the stack is set on a press machine, and pressed at a heating temperature of 110° C. and a pressure of 1.0 MPa, for 5 minutes to 20 minutes or around. The non-water permeable base, the water permeable base and the water absorptive sheet are removed, to thereby manufacture the insulating sheet.

[Passive Element]

The passive element of the present invention will be explained referring to FIG. 1. FIG. 1 is a cross sectional view illustrating a capacitor 100 as one embodiment of the passive element of the present invention.

The passive element of the present invention (capacitor 100) has a high-k layer 10 which is composed of the above-described insulating material of the present invention, and an electroconductive part 20 stacked on the high-k layer 10.

The passive element in this embodiment means an element having no self-energizing source, but taking part in any one operation or combined operations of accumulation, consumption and dissipation of fed energy such as electric power. High dielectricity of the high-k layer 10 means that the layer has a dielectric constant larger than that of a sheet substantially composed of cellulose nanofiber only. More specifically, the insulating material of the present invention having a dielectric constant ($\in$) of 6 or larger is preferable as the high-k layer 10, and the insulating material of the present invention having a dielectric constant ($\in$) of 10 or larger is more preferable as the high-k layer 10.

The passive element of the present invention enjoys characteristic of the high-k layer 10. That is, the high-k layer 10, which is mainly composed of a fiber assembly containing CNF as a major constituent, may be reduced in weight and may be made flexible. Since the electroconductive metal material is supported by the fiber assembly, the high-k layer 10 is increased in the dielectricity as compared with a general paper base, or with a fiber assembly substantially composed of CNF only. The present invention can therefore provide a high-performance passive element in a technical field, which is so-called paper electronics.

The high-k layer 10 is increased in the dielectricity but is suppressed from increasing in the dielectric loss tangent, so that the passive element of the present invention is excellent as a capacitor, inductor, or antenna component. The antenna component is exemplified by passive antenna component.

The capacitor 100, which is the passive element of the present invention, will be explained below.

In the capacitor 100, an electroconductive part 20 has, formed on one surface of the high-k layer 10, a first electrode 21A, a first electrode 22A, a first electrode 23A and a first electrode 24A, and also has, formed on the other surface, a second electrode 21B, a second electrode 22B, a second electrode 23B and a second electrode 24B. The first electrode 21A and the second electrode 21B, the first electrode 22A and the second electrode 22B, the first electrode 23A and the second electrode 23B, and, the first electrode 24A and the second electrode 24B are respectively opposed to configure electrode pairs.

A method of providing the electroconductive part 20 to the high-k layer 10 is not specifically limited. For example, the electroconductive part 20 may be formed as a printed product on the high-k layer 10 typically by screen printing using an electroconductive paste. Other printing techniques include ink jet printing, gravure printing and flexographic printing. The electroconductive paste is exemplified by silver paste and copper paste, but not limited thereto. The electroconductive paste is selectable from various types such as oven-drying type, heat curing type, and ultraviolet curing type. Temperature in the manufacturing process of the capacitor 100, when configured using the high-k layer 10, is preferably 100° C. or higher and 300° C. or lower. From this point of view, the electroconductive paste is preferably selected from those characterized by an annealing temperature of 250° C. or lower.

By forming the electroconductive part 20 so as to be directly stacked on the high-k layer 10, the air layer no longer resides between the high-k layer 10 and the electroconductive part 20. The capacitor 100 can therefore ensure a large value of static capacitance. The capacitor 100 of course enjoys good dielectric characteristics of the high-k layer 10.

In other words, since the high-k layer 10, mainly configured by CNF, has a good surface smoothness, and is therefore suitable for direct stacking of the electroconductive part 20, so that the good capacitor 100 may be provided by using the high-k layer 10.

Other methods of forming the electroconductive part 20 are exemplified by sputtering and vacuum evaporation. By forming the electroconductive part 20 in the form of metal film by any of these methods directly on the high-k layer 10, the capacitor 100 will be ensured with high static capacitance as described above.

The capacitor 100 has a plurality of electrode pairs provided in plane on the high-k layer 10. Provision of the plurality of electrode pairs in the capacitor 100 enables high integration of the capacitors. For example, one capacitor 100 with a plurality of electrode pairs may be incorporated, in place of mounting a plurality of separate chips in an arbitrary electronic part. The electronic part is thus downsized and reduced in weight.

Static capacitance C of the capacitor 100 is determined by (Formula 2) below.

(Mathematical Formula 2)

$$C = \in_Y \times \in_0 \times S/d \quad \text{(Formula 2)}$$

C: Static capacitance of capacitor 100
$\in_Y$: Dielectric constant of high-k layer 10
$\in_0$: Dielectric constant of vacuum ($8.85 \times 10^{-12}$)
S: Opposing area of electrode pair
d: Distance between electrodes Accordingly, the capacitor 100 is preferably designed while appropriately balancing among a desired level of static capacitance C, thickness of the high-k layer 10, and opposing area of the electrode pairs. In particular, the thickness of the high-k layer 10 is preferably controlled based on the desired level of static capacitance C.

For the case where the plurality of electrode pairs 10 are provided on the high-k layer 10 as exemplified by the capacitor 100, each electrode pair may configure each capacitor. By forming the plurality of electrode pairs while being appropriately spaced from each other, a plurality of capacitors may be provided in a highly integrated manner to a single high-k layer 10.

Even for the case where the plurality of electrode pairs are formed in a single high-k layer as exemplified by the capacitor 100, it is general to keep the thickness d and dielectric constant $\in_Y$ of the high-k layer 10 constant over the entire plane of the high-k layer 10. Accordingly, it is preferable in this case to achieve a desired level of static capacitance C by controlling the opposing area S of each electrode pair (each capacitor provided to a single high-k layer 10).

[Circuit Board]

Figure 2:
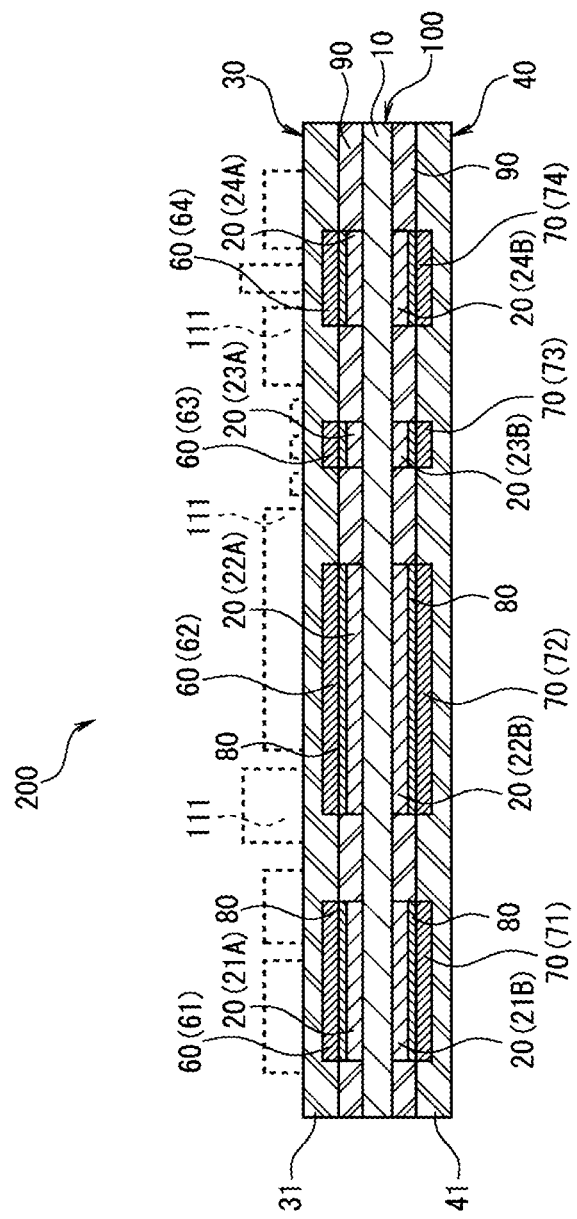
FIG. 2 is a cross sectional view illustrating a capacitor-embedded circuit board of the present invention.

A capacitor-embedded circuit board, as one example of the circuit board of the present invention, will be explained referring to FIG. 2. FIG. 2 is a cross sectional view of a capacitor-embedded circuit board 200 as one embodiment of the circuit board of the present invention.

The capacitor-embedded circuit board 200 is configured by laminating an interconnect board 30 on one surface of the capacitor 100, and by laminating an interconnect board 40 on the other surface. It is also allowable to stack one or more interconnect boards on the capacitor-embedded circuit board 200 to thereby configure a multi-layered circuit board.

As illustrated in FIG. 2, the circuit board (capacitor-embedded circuit board 200) according to one embodiment of the present invention has the passive element of the present invention (capacitor 100), and interconnect boards (an interconnect board 30 and an interconnect board 40) opposed while placing the passive element (capacitor 100) in between.

The passive element (capacitor 100) has the above-described high-k layer 10 composed of the insulating material of the present invention and, as the electroconductive part stacked on the high-k layer 10, the first electrode 21A, the first electrode 22A, the first electrode 23A and the first electrode 24A, and the second electrode 21B, the second electrode 22B, the second electrode 23B and the second electrode 24B.

More specifically, the capacitor-embedded circuit board 200 having the capacitors as the passive element has the high-k layer 10, and, as stacked on the high-k layer 10, the first electrode 21A, the first electrode 22A, the first electrode 23A, the first electrode 24A, the second electrode 21B, the second electrode 22B, the second electrode 23B and the second electrode 24B. The first electrode 21A, the first electrode 22A, the first electrode 23A and the first electrode 24A are provided to one surface of the high-k layer 10. On the other hand, the second electrode 21B, the second electrode 22B, the second electrode 23B and the second electrode 24B are provided to the other surface of the high-k layer 10. The first electrode 21A, first electrode 22A, the first electrode 23A and the first electrode 24A are opposed respectively with the second electrode 21B, the second electrode 22B, the second electrode 23B and the second electrode 24B, while placing the high-k layer 10 in between, so as to form electrode pairs, to thereby configure capacitors. The capacitor-embedded circuit board 200 is configured to have the interconnect board 30 and the interconnect board 40 which are opposed to each other while placing the capacitors in between.

On the exposed surface of the interconnect board 30, a plurality of surface mounted components 111 are mounted.

The circuit board of the present invention (capacitor-embedded circuit board 200) has a built-in passive element (capacitor 100) having the electroconductive part (first electrode, second electrode) fabricated in the plane. Accordingly, the circuit board is successfully reduced in weight and thinned, as compared with the conventional multi-layered circuit board having built-in chip parts (also referred to as "conventional multi-layered circuit board", hereinafter).

In some cases, the conventional multi-layered circuit board has been suffering from poor electrical reliability, due to air which possibly resides between the built-in chip and the high-k layer. In contrast, in the circuit board of the present invention (capacitor-embedded circuit board 200), the conductors (first electrode, second electrode) are stacked directly or indirectly on the high-k layer 10, and is therefore configured so that the air is unlikely to reside between the conductors (first electrode, second electrode) and the high-k layer 10.

In the capacitor-embedded circuit board 200, the high-k layer 10, the first electrode 21A, the first electrode 22A, the first electrode 23A, the first electrode 24A, the second electrode 21B, the second electrode 22B, the second electrode 23B, and the second electrode 24B are same as those previously shown in conjunction with the capacitor 100, and will not be detailed repetitively.

The interconnect board 30 is configured to have an interconnect layer 60 formed on one surface of a base 31. The interconnect layer 60 has a plurality of interconnect parts (interconnect part 61, interconnect part 62, interconnect part 63, interconnect part 64). The interconnect board 40 is configured to have an interconnect layer 70 formed on one surface of a base 41. The interconnect layer 70 has a plurality of interconnect parts (interconnect part 71, interconnect part 72, interconnect part 73, interconnect part 74).

The base 31 and the base 41 are arbitrarily selectable from various insulating bases usable as a base for the interconnect board. For example, the base 31 and the base 41 may be configured using glass-epoxy composite, Teflon-glass or alumina.

Since the capacitor 100 is configured by using the flexible high-k layer 10, also the base 31 and the base 41 are preferably configured by selecting highly flexible materials, in order to make the capacitor-embedded circuit board 200 flexible. The highly flexible materials include polyimide resin, polyamide resin and polyamide-imide resin; thermosetting resins such as epoxy resin; and thermoplastic resins such as liquid crystal polymer. A resin film composed of any of these materials is usable for the base 31 and the base 41. Alternatively, an insulating sheet composed of the insulating material of the present invention are usable for the base 31 and the base 41. This improves the biodegradability of the capacitor-embedded circuit board 200, and reduces the weight. In this case, it is better to control the dielectric constant of the insulating sheet used as the base 31 and the base 41, smaller than the dielectric constant of the high-k layer 10 used as the base of the capacitor 100. The dielectric constants of the high-k layer 10, and the insulating sheet used as the base 31 and the base 41 are controllable based on the amount of electroconductive metal material to be supported by CNF as described above.

The plurality of interconnect parts of the capacitor-embedded circuit board 200 (interconnect part 61 to interconnect part 64, interconnect part 71 to interconnect part 74) may be formed on the base 31 and the base 41, using the materials and by the method same as those for the electroconductive parts 20 of the capacitor 100 (first electrode and second electrode). When a glass base or an organic film is used for the base 31 and the base 41, the plurality of interconnect parts may also be patterned by photolithography.

The capacitor 100, the interconnect board 30 and the interconnect board 40 are laminated in an aligned manner. The interconnect layer 60 and the interconnect layer 70, provided to the interconnect board 30 and the interconnect board 40 respectively, have a plurality of interconnect parts arranged in predetermined regions so as to correspond with the electroconductive parts 20 on the high-k layer 10.

More specifically, in the capacitor-embedded circuit board 200 illustrated in FIG. 2, on one surface of the high-k layer 10, a part of the interconnect part 61 is electrically connected to the first electrode 21A. Similarly, the interconnect part 62 is electrically connected to the first electrode 22A, the interconnect part 63 is electrically connected to the first electrode 23A, and the interconnect part 64 is electrically connected to the first electrode 24A. On the other hand, on the other surface of the high-k layer 10, a part of the interconnect part 71 is electrically connected to the second electrode 21B. Similarly, the interconnect part 72 is electrically connected to the second electrode 22B, the interconnect part 73 is electrically connected to the second electrode 23B, and the interconnect part 74 is electrically connected to the second electrode 24B. "Electrically connected" herein means that the individual electroconductive parts 20, and the individual interconnect parts (interconnect part 61 to interconnect part 64, interconnect part 71 to interconnect part 74) are connected in a conductive manner. The individual electroconductive parts 20 and the individual interconnect parts may be connected electrically, while placing in between an adhesive layer composed of an electroconductive connecting material, such as an electroconductive adhesive, electroconductive adhesive sheet, electroconductive tacky sheet, anisotropic electroconductive film, or anisotropic electroconductive paste. In FIG. 2, the individual electroconductive part 20 and the individual interconnect parts are opposed and electrically connected, while placing an electroconductive adhesive layer 80 in between.

In the region where the high-k layer 10 and the base 31 are faced without placing the interconnect layer 60, the interconnect layer 70 or the electroconductive part 20 in between, an intermediate layer 90 may be provided on occasions. In the region where the high-k layer 10 and the base 41 are faced without placing the interconnect layer 60, the interconnect layer 70 or the electroconductive part 20 in between, an intermediate layer 90 may be provided on occasions. By forming the intermediate layer 90 as described above, the circuit may be prevented from being interposed with air. The intermediate layer 90 may be formed, preliminarily at predetermined positions on the interconnect board 30 and the interconnect board 40, or at predetermined positions on the capacitor 100. Still alternatively, the intermediate layer 90 may be formed when the interconnect board 30 and the interconnect board 40 are stacked with the capacitor 100, at predetermined positions on the interconnect board 30 and the interconnect board 40, or at predetermined positions on the capacitor 100.

The paragraphs above have described the capacitor-embedded circuit board 200 which was configured by independently preparing the capacitor 100, the interconnect board 30 and the interconnect board 40, and by stacking them as aligned.

The method of configuring the capacitor-embedded circuit board 200 is, however, not limited thereto. For example, while not illustrated, the interconnect board 30 may further have the first electrode 21A, the first electrode 22A, the first electrode 23A and the first electrode 24A, which correspond to the individual interconnect parts, formed so as to be stacked on the interconnect layer 60, to thereby form the electrode-mounted interconnect board 30. Similarly, the interconnect board 40 may further have the second electrode 21B, the second electrode 22B, the second electrode 23B and the second electrode 24B, which correspond to the individual interconnect parts, formed so as to be stacked on the interconnect layer 70, to thereby form the electrode-mounted interconnect board 40. The electrode-mounted interconnect board 30 and the electrode-mounted interconnect board 40 are then opposed while placing the high-k layer 10 in between, and aligned so that the individual first electrodes and the individual second electrodes are positioned face-to-face. They are then adhered using an adhesive, while taking care so that air will not be entrained between the individual first electrodes and the high-k layer 10, and between the individual second electrode and the high-k layer 10. The capacitor-embedded circuit board 200 may thus be configured. The adhesive used between the individual first electrodes and the high-k layer 10, and between the individual second electrodes and the high-k layer 10 are not specifically be limited. For example, the adhesive is preferably an insulating adhesive composed of a high-k component, or an insulating adhesive containing a high-k component. This is to further improve characteristics of the capacitor configured by the individual first electrodes and the individual second electrodes opposed while placing the high-k layer 10 in between, by elevating the dielectricity also in the adhesive layer in the capacitor.

EXAMPLES

Example 1

An insulating sheet as the insulating material of the present invention was manufactured as described below, to obtain Example 1.

A pulp material (hardwood sulfite pulp) with an average fiber diameter or approximately 20 µm was suspended in water, to thereby prepare a cellulose suspension (0.5 wt %).

The cellulose suspension was micronized by a wet mechanical processing, to obtain a cellulose nanofiber suspension (0.35 wt %) having suspended therein a cellulose nanofiber with an average fiber diameter of 20 nm and an average fiber length of 5 µm. A water jet mill (Star Burst HJP-25005E) from Sugino Machine Ltd. was used for the wet mechanical processing. Milling was conducted under 245 MPa and 50 pass the number of repetitions.

The cellulose nanofiber suspension was added with a silver nanowire with an average fiber diameter of 70 nm, and an average fiber length of 10 µm, while adjusting the content of silver nanowire to 0.5 parts by mass per 100 parts by mass of cellulose nanofiber, to thereby prepare a suspension to be filtered. The silver nanowire used herein had a specific gravity of 10.5 g/cm$^3$.

The suspension to be filtered was then filtered under reduced pressure using a suction filter attached with an aspirator, to thereby manufacture a filter sheet composed of the cellulose nanofiber and the silver nanowire on the filter. The filter used herein was a cellulose ester membrane (mixed cellulose ester membrane A010A090C, from Advantec Toyo Kaisha, Ltd.).

On the exposed surface of the filter sheet obtained as described above, a sheet glass was placed. Next, on the exposed surface of the filter, two sheets of paper towel (Kimtowel 61000, from Nippon Paper Crecia Co., Ltd.) were stacked for water absorption, to thereby form a stack composed of the paper towel, the filter placed on the paper towel, the filter sheet placed on the filter, and the sheet glass placed on the filter sheet.

The stack was then set on a press machine (compression molding machine AYSR-5, from Shinto Metal Industries Corporation), and pressed at 110° C. under 1.0 MPa for 20 minutes. Pressing and drying were thus conducted concurrently. The stack was then taken out from the press machine, and allowed to cool naturally down to room temperature. The paper towel, the filter, and the sheet glass were removed to obtain an insulating sheet of Example 1.

Example 2 to Example 6

Insulating sheets were manufactured in the same way as Example 1, except that the ratio of mixing of silver nanowire, relative to the cellulose nanofiber was altered as summarized in Table 1, to obtain Example 2 to Example 6.

Example 7 to Example 9

Insulating sheets were manufactured in the same way as Example 1, except that the electroconductive metal material to be used was altered to a flaky silver material (Silcoat AgC-224, from Fukuda Metal Foil & Powder Co., Ltd.), and that the ratio of mixing of the silver material, relative to the cellulose nanofiber, was altered as summarized in Table 2, to obtain Example 7 to Example 9.

Comparative Example 1

A commercially available paper material (5A 01511110, from Advantec Toyo Kaisha, Ltd.) was cut into a test piece of 75 mm in diameter, to obtain Comparative Example 1.

Comparative Example 2

A test piece was manufactured in the same way as Example 1, except that the electroconductive material was not used, to obtain Comparative Example 2.

Reference Example 1 and Reference Example 2

Test pieces were manufactured in the same way as Example 1, except that barium titanate (No. 322-43432, from Wako Pure Chemical Industries, Ltd.) with a mean particle diameter of 100 nm was used instead of the electroconductive metal material, and that the ratio of mixing thereof relative to the cellulose nanofiber was altered as summarized in Table 2. The thus-obtained test pieces were denoted as Reference Example 1 and Reference Example 2.

Reference Example 3

A test piece was manufactured in the same way as Example 1, except that the ratio of mixing of silver nanowire relative to the cellulose nanofiber was altered as summarized in Table 2, to thereby obtain Reference Example 3.

The thus-obtained test pieces of Example 1 to Example 9, Comparative Example 1, Comparative Example 2, and Reference Example 1 to Reference Example 3 were evaluated as described below. Results of evaluation were summarized in Table 1 and Table 2.

[Measurement of Thickness]

Using a thickness gauge (Micrometer 293-230, from Mitsutoyo Corporation), the thickness of each test piece was measured at ten arbitrary points. The measured values were averaged to determine an average thickness.

[Measurement of Dielectric Constant (∈)] [Measurement of Dielectric Loss Tangent (tan σ)]

Dielectric constant (∈) and dielectric constant (∈) of each test piece were measured in compliance with IPC Standard TM-650(2,5,5,3). The measurement was conducted at 1.1 GHz, 25° C., 50RH %, using a network analyzer (E5071C, from Agilent Technologies, Inc.) and a resonator (SPDR-1.1 GHz, from QWED Sp. z o.o.).

Electrical resistivity of Example 1 to Example 6, and Reference Examples 1 to 3 was measured according to the method below. Results are summarized in Table 1 and Table 2.

[Measurement of Electrical Resistivity ρ (Ω·cm)]

(1) Electrical resistivity ρ of Example 1 to Example 6 was measured using an electrical resistivity measuring instrument 4339B from Agilent Technologies, Inc., at a voltage of 100 V for 60 seconds.

(2) Electrical resistivity ρ of Reference Example 1 to Reference Example 3 was measured using an electrical resistivity measuring instrument Loresta AX from Mitsubishi Chemical Analytech Co., Ltd., based on the four-terminal method. The model of electrical resistivity measuring instrument was thus altered for Reference Example 1 to Reference Example 3 for appropriate measurement, since these test pieces showed electroconductivity which exceeds the level of that of insulating material.

Also product (A) of dielectric constant (∈) and electrical resistivity (Ω·cm), and percentage (B) given by formula (2) below were calculated for each Example, each Comparative Example and each Reference Example. Results are summarized in Table 1 and Table 2.

(Formula 2)

Dielectric loss tangent(tan δ)/Dielectric constant(∈)× 100    (B)

As summarized in Table 1 and Table 2, all of Example 1 to Example 9 were found to be improved in the dielectric constant, as compared with Comparative Example 1 and Comparative Example 2. In particular from comparison between Comparative Example 2 and each of Example 1 to Example 9, elevation in dielectricity, as a result of support of the electroconductive metal material by the cellulose nanofiber, was confirmed. In particular, Example 1 to Example 6 using the fibrous electroconductive metal material were found to remarkably increase in the dielectric constant, despite small ratio of mixing of electroconductive metal material relative to the cellulose nanofiber.

Reference Example 1 and Reference Example 2, using barium titanate which is generally known as a high-k material in place of the electroconductive metal material, were found to increase in the dielectric constant as compared with Comparative Example 2.

From comparison of Example 1 to Example 9 with Reference Example 1 and Reference Example 2, it was found that Example 1 to Example 6 increased in the dielectric constant to a level equal to or greater than the level of Reference Example 1 and Reference Example 2, despite the electroconductive metal material was used. For example, from comparison of Example 4 having 3 wt % of silver nanowire mixed therein, with Reference Example 1 having 3 wt % of barium titanate mixed therein, Example 4 was found to show a remarkable increase in the dielectric constant. From comparison of Example 8 having 50 wt % of flaky silver material mixed therein, with Reference Example 2 having 50 wt % of barium titanate mixed therein, Example 8 was found to increase in the dielectric constant to the same level as the Reference Example 2.

Reference Example 3 represents an exemplary case with an increased ratio of mixing of silver nanowire. Reference Example 3 was found to fail in measurement of dielectric constant, and was no longer recognized as an insulating material.

TABLE 1

|  | Example1 | Example2 | Example3 | Example4 | Example5 | Example6 |
| --- | --- | --- | --- | --- | --- | --- |
| Size of test piece (mm) | ϕ75 | ϕ75 | ϕ75 | ϕ75 | ϕ75 | ϕ75 |
| Thickness of test piece (μm) | 44 | 42 | 45 | 43 | 50 | 48 |
| Type of entangled fiber composite | CNF | CNF | CNF | CNF | CNF | CNF |

TABLE 1-continued

|  |  | Example1 | Example2 | Example3 | Example4 | Example5 | Example6 |
|---|---|---|---|---|---|---|---|
| Electroconductive metal material | Material | AgNW | AgNW | AgNW | AgNW | AgNW | AgNW |
|  | Ratio of mixing relative to entangled fiber composite (wt %) | 0.5 | 1 | 1.5 | 3 | 5 | 10 |
| Non-electroconductive metal material | Material | 0 | 0 | 0 | 0 | 0 | 0 |
|  | Ratio of mixing relative to entangled fiber composite (wt %) | 0 | 0 | 0 | 0 | 0 | 0 |
| Dielectric constant: $\epsilon$ |  | 11.4 | 20.3 | 25.1 | 47.1 | 102.8 | 391.4 |
| Dielectric loss tangent: $\tan\delta$ |  | 0.21 | 0.17 | 0.16 | 0.19 | 0.19 | 0.29 |
| Electrical resistivity: $\rho$ ($\Omega \cdot$ cm) |  | $5.28 \times 10^{10}$ | $7.98 \times 10^{10}$ | $7.25 \times 10^{10}$ | $4.62 \times 10^{10}$ | $3.12 \times 10^{10}$ | $2.29 \times 10^{10}$ |
| Dielectric constant × electrical resistivity (A) |  | $6.02 \times 10^{11}$ | $1.62 \times 10^{12}$ | $1.82 \times 10^{12}$ | $2.18 \times 10^{12}$ | $3.21 \times 10^{12}$ | $8.96 \times 10^{12}$ |
| (Dielectric loss tangent/dielectric constant) × 100 (B) |  | 1.84 | 0.84 | 0.64 | 0.40 | 0.18 | 0.07 |

TABLE 2

|  |  | Example7 | Example8 | Example9 | Comparative Example 1 | Comparative Example 2 | Reference Example 1 | Reference Example 2 | Reference Example 3 |
|---|---|---|---|---|---|---|---|---|---|
| Size of test piece (mm) |  | ϕ75 | ϕ75 | ϕ75 | ϕ75 | ϕ75 | ϕ75 | ϕ75 | ϕ75 |
| Thickness of test piece (μm) |  | 55 | 71 | 108 | 241 | 42 | 45 | 67 | 52 |
| Type of entangled fiber composite |  | CNF | CNF | CNF | Paper | CNF | CNF | CNF | CNF |
| Electroconductive metal material | Material | Ag flake | Ag flake | Ag flake | — | — | — | — | AgNW |
|  | Ratio of mixing relative to entangled fiber composite (wt %) | 30 | 50 | 80 | 0 | 0 | 0 | 0 | 30 |
| Non-electroconductive metal material | Material | 0 | 0 | 0 | 0 | 0 | BaTiO$_3$ | BaTiO$_3$ | 0 |
|  | Ratio of mixing relative to entangled fiber composite (wt %) | 0 | 0 | 0 | 0 | 0 | 3 | 50 | 0 |
| Dielectric constant: $\epsilon$ |  | 6.3 | 7.1 | 23.1 | 2 | 5.3 | 5.7 | 8.3 | NG |
| Dielectric loss tangent: $\tan\delta$ |  | 0.24 | 0.25 | 0.19 | 0.1 | 0.2 | 0.21 | 0.17 | NG |
| Electrical resistivity: $\rho$ ($\Omega \cdot$ cm) |  | — | — | — | — | — | $1.75 \times 10^{11}$ | $8.02 \times 10^{10}$ | $2.05 \times 10^{-3}$ |
| Dielectric constant × electrical resistivity (A) |  | — | — | — | — | — | $1.00 \times 10^{12}$ | $6.58 \times 10^{11}$ | — |
| (Dielectric loss tangent/dielectric constant) × 100 (B) |  | — | — | — | — | — | 3.68 | 2.07 | — |

The insulating material of the present invention shows larger dielectric constant ($\in$) as compared with the conventional paper or fiber assembly composed of cellulose nanofiber. The insulating material of the present invention is therefore usable in various electronic parts, as an insulating material making full use of lightness and flexibility of cellulose.

According to the method of manufacturing an insulating sheet of the present invention, the insulating material of the present invention may be manufactured easily in the form of sheet. Since the method of manufacturing an insulating sheet of the present invention employs cellulose nanofiber as a major constituent of the sheet, the sheet will have a small void among the fibers composing the sheet, and thereby the electroconductive metal material may successfully be supported among the fibers.

The passive element of the present invention is successfully reduced in weight and made flexible, by using the insulating material of the present invention as the high-k layer, and is ensured to function as a passive element. The passive element of the present invention is also usable for applications where biodegradability of the high-k layer is appreciated.

The circuit board of the present invention has a built-in capacitor as the passive element of the present invention. The circuit board of the present invention is, therefore, no longer necessary to incorporate chip parts therein, or can reduce the number of chip parts to be incorporated therein. Therefore, the circuit board of the present invention may successfully be reduced in weight and thinned.

The embodiments above encompass the technical spirits below.

(1) An insulating material which includes a fiber assembly mainly composed of a cellulose nanofiber, and
an electroconductive metal material supported by the fiber assembly.

(2) The insulating material described in (1), wherein the electroconductive metal material is a fibrous material.

(3) The insulating material described in (1) or (2), represented by a product of dielectric constant ($\in$) and electrical resistivity ($\Omega \cdot$cm) of $1 \times 10^{11}$ or larger.

(4) The insulating material described in any one of (1) to (3), represented by dielectric loss tangent (tan δ) and dielectric constant ($\in$) which satisfy the relational expression below:

(Mathematical Formula 1)

[Dielectric loss tangent(tan δ)/Dielectric constant ($\in$)]×100≤2.0     (Formula 1)

(5) The insulating material described in any one of (1) to (4), wherein the electroconductive metal material is a silver-based fibrous material, and the content of the silver-based fibrous material is 20 parts by mass or less per 100 parts by mass of the cellulose nanofiber.

(6) A method of manufacturing an insulating sheet which is mainly composed of a cellulose nanofiber, the method includes:

filtering a suspension which contains a fiber material mainly composed of the cellulose nanofiber and an electroconductive metal material, to thereby form a filter sheet which contains the fiber material and the electroconductive metal material; and drying the filter sheet.

(7) The method of manufacturing an insulating sheet described in (6), further includes:

pressing the filter sheet concurrently with the step of drying.

(8) A passive element which includes:

a high-k layer which is composed of the insulating material described in any one of (1) to (5); and an electroconductive part which is stacked on the high-k layer.

(9) The passive element described in (8), wherein the passive element is a capacitor, in which the electroconductive part has a first electrode provided on one surface of the high-k layer, and a second electrode provided on the other surface, the first electrode and the second electrode being opposed to configure an electrode pair.

(10) The passive element described in (9), wherein a plurality of electrode pairs are provided in the plane of the high-k layer.

(11) A circuit board which includes:

a passive element which has a high-k layer composed of the insulating material descried in any one of (1) to (5), and an electroconductive part which is stacked on the high-k layer; and interconnect boards which are opposed while placing the passive element in between.

(12) The circuit board described in (11), wherein the passive element is a capacitor, in which the electroconductive part has a first electrode provided on one surface of the high-k layer, and a second electrode provided on the other surface, the first electrode and the second electrode being opposed to configure an electrode pair.

It is apparent that the present invention is not limited to the above embodiment, and may be modified and changed without departing from the scope and spirit of the invention.

10 . . . high-k layer, 20 . . . electroconductive part, 21A . . . first electrode, 21B . . . second electrode, 22A . . . first electrode, 22B . . . second electrode, 23A . . . first electrode, 23B . . . second electrode, 24A . . . first electrode, 24B . . . second electrode, 30 . . . interconnect board, 31 . . . base, 40 . . . interconnect board, 41 . . . base, 60 . . . interconnect layer, 61 . . . interconnect part, 62 . . . interconnect part, 63 . . . interconnect part, 64 . . . interconnect part, 70 . . . interconnect layer, 71 . . . interconnect part, 72 . . . interconnect part, 73 . . . interconnect part, 74 . . . interconnect part, 80 . . . electroconductive adhesive layer, 90 . . . intermediate layer, 100 . . . capacitor, 111 . . . surface mounted component, 200 . . . capacitor-embedded circuit board

What is claimed is:

1. An insulating material comprising a fiber assembly mainly composed of a cellulose nanofiber, and an electroconductive metal material supported by the fiber assembly, wherein the electroconductive metal material is fibrous, and the fibrous electroconductive metal material, supported by 100 g of cellulose nanofiber, has a total length of $1 \times 10^7$ m or longer and $5 \times 10^8$ m or shorter.

2. The insulating material according to claim 1, wherein the electroconductive metal material is a fibrous material.

3. The insulating material according to claim 1, represented by a product of dielectric constant (∈) and electrical resistivity (Ω·cm) of $1 \times 10^{11}$ or larger.

4. The insulating material according to claim 1, represented by dielectric loss tangent (tan δ) and dielectric constant (∈) which satisfy the relational expression below:

(Mathematical Formula 1)

$$[\text{Dielectric loss tangent}(\tan \delta)/\text{Dielectric constant}(\in)] \times 100 \leq 2.0 \quad \text{(Formula 1)}$$

5. The insulating material according to claim 1, wherein the electroconductive metal material is a silver-based fibrous material, and the content of the silver-based fibrous material is 20 parts by mass or less per 100 parts by mass of the cellulose nanofiber.

6. The insulating material according to claim 1, wherein the content of the cellulose nanofiber is 90% by mass or more per 100% by mass of the fiber assembly.

7. The insulating material according to claim 1, wherein the content of the cellulose nanofiber is 95% by mass or more per 100% by mass of the fiber assembly.

8. The insulating material according to claim 1, wherein the content of the cellulose nanofiber is 99% by mass or more per 100% by mass of the fiber assembly.

9. The insulating material according to claim 1, wherein the electroconductive metal material is a fibrous material, and the fibrous material is composed of any one metal material selected from the group consisting of silver, metal materials composed of silver and other metals, copper, and metal materials composed of copper and other metals excluding silver.

10. The insulating material according to claim 1, wherein the electroconductive metal material is a fibrous material, and the fibrous material has an aspect ratio of 200 or smaller.

11. The insulating material according to claim 1, wherein the electroconductive metal material is a fibrous material, and the fibrous material has an aspect ratio of 100 or smaller.

12. A passive element comprising:

a high-k layer which is composed of the insulating material described in claim 1; and an electroconductive part which is stacked on the high-k layer.

13. The passive element according to claim 12, wherein the passive element is a capacitor, in which the electroconductive part has a first electrode provided on one surface of the high-k layer, and a second electrode provided on the other surface, the first electrode and the second electrode being opposed to configure an electrode pair.

14. The passive element according to claim 13, wherein a plurality of electrode pairs are provided in the plane of the high-k layer.

15. A circuit board comprising:
a passive element which has a high-k layer composed of the insulating material descried in claim 1, and an electroconductive part which is stacked on the high-k layer; and
interconnect boards which are opposed while placing the passive element in between.

16. The circuit board according to claim 15,
wherein the passive element is a capacitor, in which the electroconductive part has a first electrode provided on one surface of the high-k layer, and a second electrode provided on the other surface, the first electrode and the second electrode being opposed to configure an electrode pair.

17. A method of manufacturing an insulating sheet which is mainly composed of a cellulose nanofiber, the method comprising: filtering a suspension which contains a fiber material mainly composed of the cellulose nanofiber and an electroconductive metal material, to thereby form a filter sheet which contains the fiber material and the electroconductive metal material; and drying the filter sheet, wherein the electroconductive metal material is fibrous, and the fibrous electroconductive metal material, supported by 100 g of cellulose nanofiber, has a total length of $1\times10^7$ m or longer and $5\times10^8$ m or shorter.

18. The method of manufacturing an insulating sheet according to claim 17, further comprising:
pressing the filter sheet concurrently with the step of drying.

* * * * *